United States Patent
Bahng et al.

(10) Patent No.: US 8,293,016 B2
(45) Date of Patent: Oct. 23, 2012

(54) APPARATUS FOR EFFICIENT REMOVAL OF HALOGEN RESIDUES FROM ETCHED SUBSTRATES

(75) Inventors: Kenneth J. Bahng, Cupertino, CA (US); Matthew F. Davis, Felton, CA (US); Travis Morey, Austin, CA (US); James D. Carducci, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 532 days.

(21) Appl. No.: 12/572,786

(22) Filed: Oct. 2, 2009

(65) Prior Publication Data
US 2010/0133255 A1    Jun. 3, 2010

Related U.S. Application Data

(60) Provisional application No. 61/103,435, filed on Oct. 7, 2008.

(51) Int. Cl.
*C23C 16/00* (2006.01)
(52) U.S. Cl. .......................... 118/725; 118/726
(58) Field of Classification Search .................. 118/725, 118/728
See application file for complete search history.

(56) References Cited

U.S. PATENT DOCUMENTS

| | | | |
|---|---|---|---|
| 5,906,684 A | 5/1999 | Tamura et al. | |
| 6,874,515 B2 | 4/2005 | Ishihara et al. | |
| 2003/0029564 A1* | 2/2003 | Brown et al. | 156/345.1 |
| 2003/0234548 A1 | 12/2003 | Aggarwal | |
| 2007/0139856 A1 | 6/2007 | Holland et al. | |
| 2009/0095222 A1* | 4/2009 | Tam et al. | 118/723 R |
| 2009/0314309 A1* | 12/2009 | Sankarakrishnan et al. | 134/1.1 |

FOREIGN PATENT DOCUMENTS

KR    10-2007-0020689    2/2007

OTHER PUBLICATIONS

PCT international search report and written opinion of PCT/US2009/059449 dated Apr. 19, 2010. Provides a concise statement of relevance for KR 10-2007-0020689.

* cited by examiner

*Primary Examiner* — Richard A. Booth
(74) *Attorney, Agent, or Firm* — Patterson & Sheridan, LLP

(57) ABSTRACT

An apparatus for removing volatile residues from a substrate is provided. In one embodiment, an apparatus for removing halogen-containing residues from a substrate includes a chamber suitable for operating maintaining a vacuum therein and a heat module positioned to heat a substrate disposed in the chamber. The apparatus for removing halogen-containing residues from a substrate also includes at least one of A) a temperature controlled pedestal having a projection extending radially therefrom suitable for supporting the temperature control pedestal on a ledge of the chamber body, the projection thermally isolating the base from the chamber body; B) a pair of substrate holders that include two support flanges extending radially inward from an inner edge of an arc-shaped body, each support flange having a substrate support step that includes a sloped landing; or C) a domed window.

11 Claims, 11 Drawing Sheets

APPARATUS FOR EFFICIENT REMOVAL OF HALOGEN RESIDUES FROM ETCHED SUBSTRATES

CROSS REFERENCE TO RELATED APPLICATIONS

This application claims benefit to U.S. Provisional Patent Application Ser. No. 61/103,435, filed Oct. 7, 2008, which is incorporated by reference in its entirety.

This application is related to U.S. patent application Ser. No. 11/553,132, filed Oct. 26, 2006, U.S. patent application Ser. No. 11/676,161, filed Feb. 16, 2007, and U.S. patent application Ser. No. 12/201,170, filed Aug. 29, 2008. All the above applications are incorporated by reference in their entirety.

BACKGROUND OF THE INVENTION

1. Field of the Invention

The present invention generally relates to an apparatus for fabricating devices on a semiconductor substrate. More specifically, the present invention relates to an apparatus for removing halogen-containing residues after plasma etching a layer on a semiconductor substrate.

2. Description of the Related Art

Ultra-large-scale integrated (ULSI) circuits may include more than one million electronic devices (e.g., transistors) that are formed on a semiconductor substrate, such as a silicon (Si) substrate, and cooperate to perform various functions within the device. Typically, the transistors used in the ULSI circuits are complementary metal-oxide-semiconductor (CMOS) field effect transistors. A CMOS transistor has a gate structure comprising a polysilicon gate electrode and gate dielectric, and is disposed between a source region and drain regions that are formed in the substrate.

Plasma etching is commonly used in the fabrication of transistors and other electronic devices. During plasma etch processes used to form transistor structures, one or more layers of a film stack (e.g., layers of silicon, polysilicon, hafnium dioxide ($HfO_2$), silicon dioxide ($SiO_2$), metal materials, and the like) are typically exposed to etchants comprising at least one halogen-containing gas, such as hydrogen bromide (HBr), chlorine ($Cl_2$), carbon tetrafluoride ($CF_4$), and the like. Such processes cause a halogen-containing residue to build up on the surfaces of the etched features, etch masks, and elsewhere on the substrate.

When exposed to a non-vacuumed environment (e.g., within factory interfaces or substrate storage cassettes) and/or during consecutive processing, gaseous halogens and halogen-based reactants (e.g., bromine ($Br_2$), chlorine ($Cl_2$), hydrogen chloride (HCl), and the like) may be released from the halogen-containing residues deposited during etching. The released halogens and halogen-based reactants create particle contamination and cause corrosion of the interior of the processing systems and factory interfaces, as well as corrosion of exposed portions of metallic layers on the substrate. Cleaning of the processing systems and factory interfaces and replacement of the corroded parts is a time consuming and expensive procedure.

Several processes have been developed to remove the halogen-containing residues on the etched substrates. For example, the etched substrate may be transferred into a remote plasma reactor to expose the etched substrate to a gas mixture that converts the halogen-containing residues to non-corrosive volatile compounds that may be out-gassed and pumped out of the reactor. However, such process requires a dedicated process chamber along with an additional step, causing increased tool expense, reduced manufacturing productivity and throughput, resulting in high manufacturing cost.

Therefore, there is a need for an improved apparatus for removing halogen-containing residues from a substrate.

SUMMARY OF THE INVENTION

An apparatus for removing volatile residues from a substrate is provided. In one embodiment, an apparatus for removing halogen-containing residues from a substrate includes a chamber suitable for operating maintaining a vacuum therein and a heat module positioned to heat a substrate disposed in the chamber. The apparatus for removing halogen-containing residues from a substrate also includes at least one of A) a temperature controlled pedestal having a projection extending radially therefrom suitable for supporting the temperature control pedestal on a ledge of the chamber body, the projection thermally isolating the base from the chamber body; B) a pair of substrate holders that include two support flanges extending radially inward from an inner edge of an arc-shaped body, each support flange having a substrate support step that includes a sloped landing; or C) a domed window disposed through a lid of the chamber.

In other embodiments, methods for removing volatile residues on an etched substrate are provided. In one embodiment, a method for removing volatile residues from a substrate includes providing a processing system having a load lock chamber and at least one processing chamber coupled to a transfer chamber, treating a substrate in the processing chamber with a chemistry comprising halogen, and removing volatile residues from the treated substrate in the load lock chamber, partially cooling the substrate in the load lock chamber while venting, and cooling the substrate removed from the load lock chamber on a substrate holder in a factory interface prior to returning the substrate to a FOUP.

In another embodiment, a method for removing volatile residues from a substrate includes providing a processing system having a load lock chamber and at least one processing chamber coupled to a transfer chamber, treating a substrate in the processing chamber with a chemistry comprising halogen, and removing volatile residues from the treated substrate in the load lock chamber.

In another embodiment, a method for removing halogen-containing residues from a substrate includes providing a processing system having a load lock chamber and at least one processing chamber coupled to a transfer chamber, treating a substrate in the processing chamber with chemistry comprising halogen, removing halogen-containing residues from the substrate in the load lock chamber, and subsequently cooling the substrate in the load lock chamber.

In another embodiment, an apparatus suitable for removing halogen-containing residues from a substrate includes at least one etch chamber, a load lock chamber interfaced with a heat module that is adapted to heat a substrate disposed in the load lock chamber, a transfer chamber having a robot disposed therein that is adapted to transfer the substrate between the etch chamber and the load lock chamber, a remote plasma source coupled to the load lock chamber.

In yet another embodiment, a domed window is provided. The domed window may include a convex member coupled to a ring. The ring includes an outside edge, an inside edge opposite the outside edge, and a lip. The lip is angled upward and extends radially inward from the inside edge. The lip is sealingly coupled to the outer edge of the convex member.

In yet another embodiment, a pedestal is provided. The pedestal includes a cooling coil disposed in a recess adjacent a bottom surface of a base. The base includes an outer wall, a projection extending radially from the outer wall, a top surface, a mounting feature positioned centrally within the base, and a countersink formed on the top surface of the base. The mounting feature has an aperture configured to accept an optical termination from the top surface. The countersink is configured to permit the entry of light into the aperture.

In yet another embodiment, a substrate holder is provided. The substrate holder includes an arc-shaped body having a mounting flange extending radially outward from an outer edge of the holder. Two support flanges are positioned at opposite ends of the body. Each support flange extends radially inward from an inner edge of the body and has a substrate support step recessed from a top side of the body. Each substrate support step has a sloped landing.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for removing halogen-containing residues from a substrate etched using an etchant that includes halogen. In one embodiment, the halogen-containing residues deposited during substrate etching are removed by a thermal treatment process performed in a load lock chamber integrated within a processing system. The load lock chamber heats the etched substrate and converts the halogen-containing residues into nonvolatile compounds which may be pumped out of the load lock chamber. By performing the halogen-containing residue removal process in the load lock chamber during the substrate transfer sequence through the load lock chamber, the residue is removed without adversely increasing the overall process cycle time. The invention substantially prevents the environment of the processing system and the substrate from contamination and corrosion while maintaining high productivity and process throughput.

Figure 1:
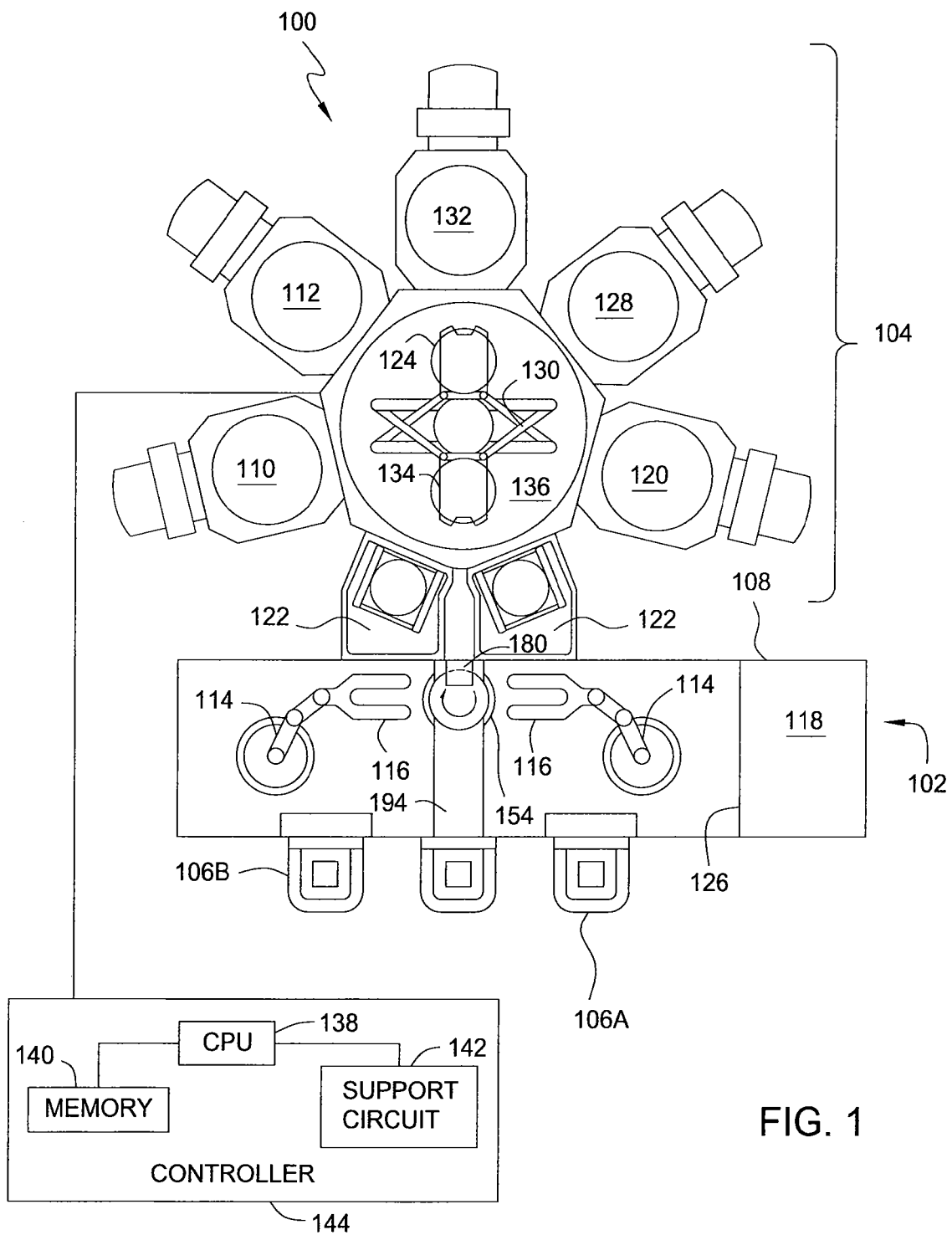
FIG. 1 depicts a schematic diagram of an exemplary processing apparatus that includes one embodiment of a load lock chamber suitable for practice the present invention.

FIG. 1 is a schematic, top plan view of an exemplary processing system 100 that includes one embodiment of a load lock chamber 122 suitable for practicing the present invention. In one embodiment, the processing system 100 may be a CENTURA® integrated processing system, commercially available from Applied Materials, Inc., located in Santa Clara, Calif. It is contemplated that other processing systems (including those from other manufacturers) may be adapted to benefit from the invention.

The system 100 includes a vacuum-tight processing platform 104, a factory interface 102, and a system controller 144. The platform 104 includes a plurality of processing chambers 110, 112, 132, 128, 120 and at least one load-lock chamber 122 that are coupled to a vacuum substrate transfer chamber 136. Two load lock chambers 122 are shown in FIG. 1. The factory interface 102 is coupled to the transfer chamber 136 by the load lock chambers 122.

In one embodiment, the factory interface 102 comprises at least one docking station 108 and at least one factory interface robot 114 to facilitate transfer of substrates. The docking station 108 is configured to accept one or more front opening unified pod (FOUP). Two FOUPS 106A-B are shown in the embodiment of FIG. 1. The factory interface robot 114 having a blade 116 disposed on one end of the robot 114 is configured to transfer the substrate from the factory interface 102 to the processing platform 104 for processing through the load lock chambers 122. Two interface robots 114 are shown in FIG. 1. Optionally, one or more metrology stations 118 may be connected to a terminal 126 of the factory interface 102 to facilitate measurement of the substrate from the FOUPS 106A-B.

Figure 1A:
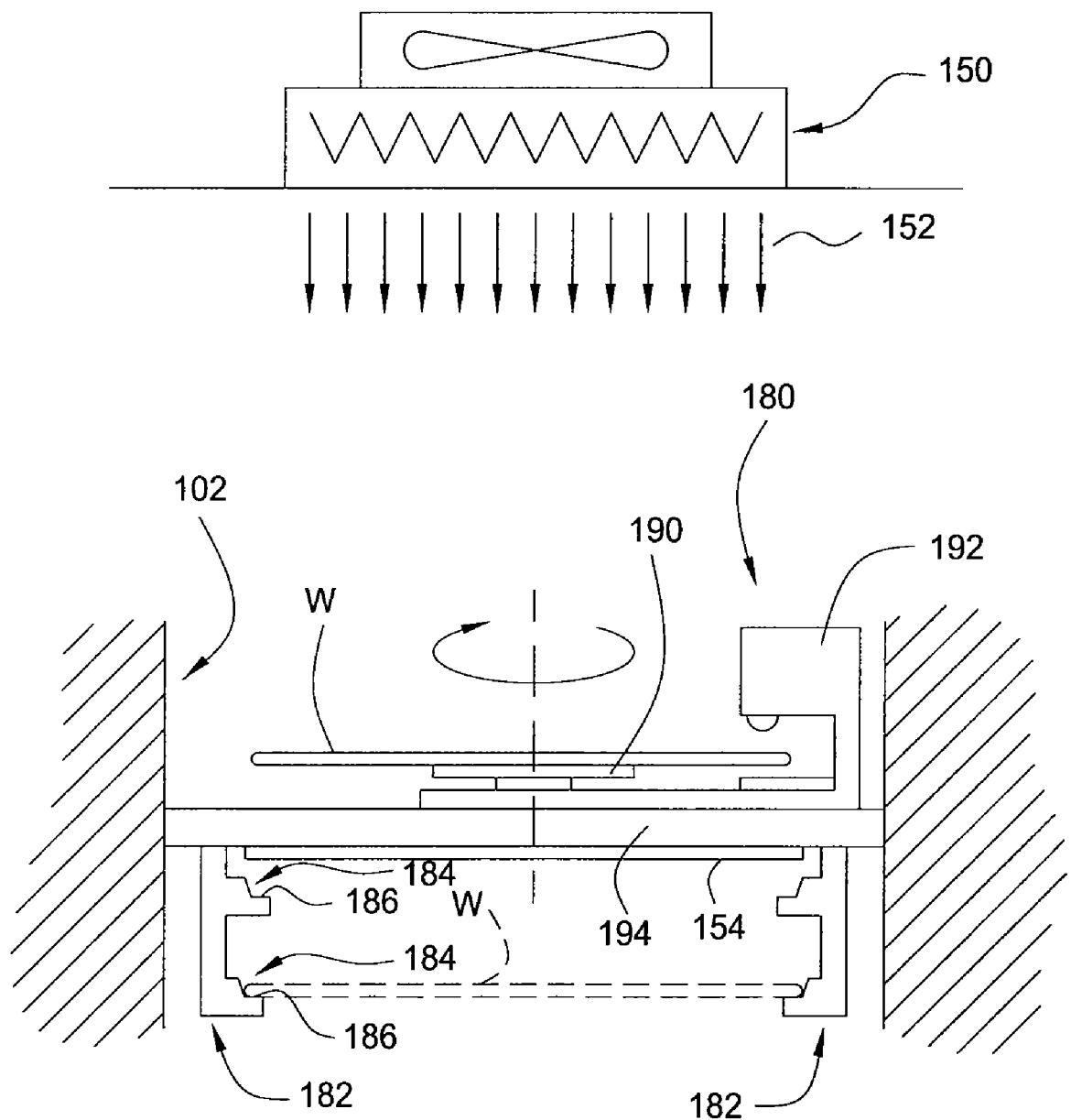
FIG. 1A depicts a partial sectional view of one embodiment of an exemplary pass through station of the processing apparatus of FIG. 1.

As additionally shown in FIG. 1 and FIG. 1A, the factory interface 102 includes a pass-through station 180 to facilitate handoff between the load lock chambers 122. The pass-through station 180 includes a substrate holder 182 which is configured to retain one or more substrates in a manner that allows a substrate to be placed and retrieved by either of the robots 114. In one embodiment, the holder 182 includes two substrate support flanges 184. Each substrate support flanges 184 has an arc shaped ledge 186 configured to retain an edge of the substrate thereon.

The substrate holder 182 may also be used as a queuing station to allow substrates to cool after retaining from the load lock chamber 122 and prior to being placed in the FOUPS 106A-B. For example, a processed substrate may be cooled in the load lock chamber 122 down to first temperature while venting the load lock chamber which is too great to be placed in the FOUP. The still hot substrate may then be placed in the substrate holder 182 for a predetermined period of time until the substrate reaches a second temperature which is low enough to be placed in the FOUP. In one embodiment, the substrate is set in the substrate holder 182 to cool for about 20-30 second. During that time, the load lock chamber 122 may be utilized to pass another substrate into the transfer chamber 136 for processing. Since the load lock chamber 122 is freed from having to completely cool the substrate to the second temperature, less time is utilized to remove substrates from the transfer chamber 136 to the factory interface 102. Accordingly, the number of substrates which can be passed through the load lock chamber 122 is advantageously increased. Additionally, the use of two or more substrate holders 182 allow at least one substrate to be cooled while maintaining a free holder 182 to allow substrate exchange between the robots 114.

In one embodiment, the pass-through station 180 is supported by a cross member 194 spanning between the walls of the factory interface 102. The pass-through station 180 may be located below the cross member 194, thus allowing space for a substrate orientation module to be mounted above the cross member 194. The substrate orientation, as conventionally known, includes a turntable 190 and sensor 192 for finding notches, flats or other indicia of the substrate's orientation.

A flow shield 154 may be mounted to the cross member 194 above the substrate holders 182. The flow shield 154 has a diameter greater than that of the substrates positioned in the substrate holders 182, whereby allowing the flow shield 154 to block flow (as indicated by arrows 152) provided by particulate air filters 150 positioned in the ceiling of the factory interface 102 to minimize potential contamination of the substrates positioned in the substrate holders 182 while cooling.

Referring back to FIG. 1, each of the load lock chambers 122 have a first port coupled to the factory interface 102 and a second port coupled to the transfer chamber 136. The load lock chambers 122 are coupled to a pressure control system (not shown) which pumps down and vents the load lock chambers 122 to facilitate passing the substrate between the vacuum environment of the transfer chamber 136 and the substantially ambient (e.g., atmospheric) environment of the factory interface 102.

The transfer chamber 136 has a vacuum robot 130 disposed therein. The vacuum robot 130 has a blade 134 capable of transferring substrates 124 between the load lock chambers 122 and the processing chambers 110, 112, 132, 128, 120.

In one embodiment, at least one process chambers 110, 112, 132, 128, 120 is an etch chamber. For example, the etch chamber may be a Decoupled Plasma Source (DPS) chamber available from Applied Materials, Inc. The DPS etch chamber uses an inductive source to produce high-density plasma and comprises a source of radio-frequency (RF) power to bias the substrate. Alternatively, at least one of the process chambers 110, 112, 132, 128, 120 may be one of a HART™, E-MAX®, DPS®, DPS II, PRODUCER E, or ENABLER® etch chamber also available from Applied Materials, Inc. Other etch chambers, including those from other manufacturers, may be utilized. The etch chambers, for example, chambers 110, 112, 132, 128, 120 may use a halogen-containing gas to etch the substrate 124 therein. Examples of halogen-containing gas include hydrogen bromide (HBr), chlorine ($Cl_2$), carbon tetrafluoride ($CF_4$), and the like. After etching the substrate 124, halogen-containing residues may be left on the substrate surface. The halogen-containing residues may be removed by a thermal treatment process in the load lock chambers 122, as will be further discussed below.

The system controller 144 is coupled to the processing system 100. The system controller 144 controls the operation of the system 100 using a direct control of the process chambers 110, 112, 132, 128, 120 of the system 100 or alternatively, by controlling the computers (or controllers) associated with the process chambers 110, 112, 132, 128, 120 and the system 100. In operation, the system controller 144 enables data collection and feedback from the respective chambers and system controller 144 to optimize performance of the system 100.

The system controller 144 generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. The software routines, such as a method 500 for removing halogen-containing residues described below with reference to FIG. 5, when executed by the CPU 138, transform the CPU 138 into a specific purpose computer (controller) 144. The software routines may also be stored and/or executed by a second controller (not shown) that is located remotely from the system 100.

Figure 2:
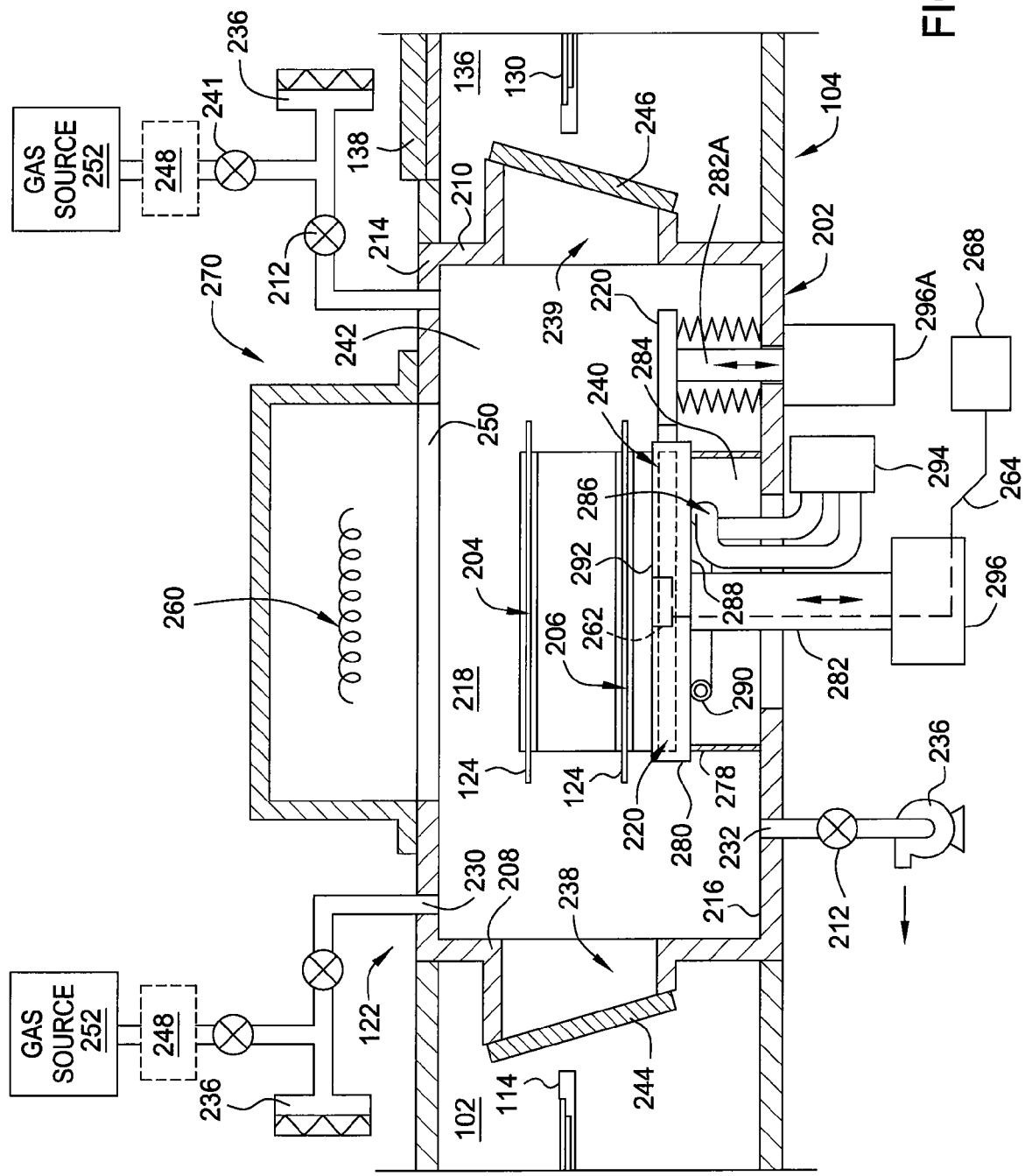
FIG. 2 depicts a sectional view of a load lock chamber utilized in FIG. 1.

FIG. 2 depicts one embodiment of the load lock chamber 122 utilized to perform a halogen-containing residue removal process. The load lock chamber 122 generally comprises a chamber body 202, a first substrate holder 204, a second substrate holder 206, a temperature control pedestal 240 and a heater module 270. The chamber body 202 may be fabricated from a singular body of material such as aluminum. The chamber body 202 includes a first side wall 208, a second side wall 210, lateral walls (242 in FIG. 3), a top 214 and a bottom 216 that define a chamber volume 218. A window 250 (shown in FIG. 4) typically comprised of quartz, is disposed in the top 214 of the chamber body 202 and is at least partially covered by the heater module 270. Another embodiment of a window is described below with reference to FIG. 6.

The pressure of the chamber volume 218 may be controlled so that the load lock chamber 122 may be evacuated to substantially match the environment of the transfer chamber 136 and be vented to substantially match the environment of the factory interface 102. Additionally, the pressure of the chamber volume 218 may be controlled within a predetermined range that facilitates performing the halogen-containing residues removal process, as further described below. The chamber body 202 includes one or more vent passages 230 and a pump passage 232. The vent passage 230 and the pump passage 232 are positioned at opposite ends of the chamber body 202 to induce laminar flow within the chamber volume 218 during venting and evacuation to minimize particulate contamination. In one embodiment, two vent passages 230 are disposed through the top 214 of the chamber body 202, while the pump passage 232 is disposed through the bottom 216 of the chamber body 202. The passages 230, 232 typically are coupled to a valve 212 to selectively allow flow into and out of the chamber volume 218. Alternatively, the passages 230, 232 may be positioned at opposite ends of one of the chamber walls, or on opposing or adjacent walls. In one embodiment, the vent passage 230 is coupled to a high efficiency air filter 236 such as available from Camfil Farr, Inc., of Riverdale, N.J.

The vent passage 230 may be additionally coupled to a gas source 252 through a valve 241 to provide a gas mixture into the chamber volume 218. In one embodiment, the vent passage 230 may be configured as a gas distribution ring wherein the gas mixture may be distributed from adjacent the walls 210, 208 through an array of holes to optimize the flow uniformity. In another embodiment, the gas mixture may be supplied to the load lock chamber 122 through a gas distribution plate (not shown) disposed below the heater module 270. The gas distribution plate may be fabricated by a material transmissive to the heat generated from the heater module 270 such as not to substantially interfere with the heating of the substrates positioned on the substrate holders 204, 206. Examples of gases that may be supplied from the gas source 252 include nitrogen ($N_2$), argon (Ar), hydrogen ($H_2$), alkanes, alkenes, helium (He), oxygen ($O_2$), ozone ($O_3$), wafer vapor ($H_2O$), and the like.

In one embodiment, a remote plasma source (RPS) 248 may be alternatively coupled to the vent passage 230 to assist in removing the halogen-containing residues from the substrate surfaces. The remote plasma source 248 provides plasma formed from the gas mixture provided by the gas source 252 to the load lock chamber 122. In embodiment the remote plasma source (RPS) 248 is present, a diffuser (not shown) may be disposed at the outlet of the vent passage 230 to facilitate delivery the generated plasma into the load lock chamber 122.

The pump passage 232 is coupled to a point-of-use pump 236, such as available from Alcatel, headquartered in Paris, France. The point-of-use pump 236 has low vibration generation to minimize the disturbance of the substrate 124 positioned on the holders 204, 206 within the load lock chamber 122 while promoting pump-down efficiency and time by minimizing the fluid path between the load lock chamber 122 and pump 236 to generally less than three feet.

A first loading port 238 is disposed in the first wall 208 of the chamber body 202 to allow the substrate 124 to be transferred between the load lock chamber 122 and the factory interface 102. A first slit valve 244 selectively seals the first loading port 238 to isolate the load lock chamber 122 from the factory interface 102. A second loading port 239 is disposed in the second wall 210 of the chamber body 202 to allow the substrate 124 to be transferred between the load lock chamber 122 and the transfer chamber 136. A second slit valve 246 which is substantially similar to the first slit valve 244 selectively seals the second loading port 239 to isolate the load lock chamber 122 from the vacuum environment of the transfer chamber 136.

The first substrate holder 204 is concentrically coupled to (i.e., stacked on top of) the second substrate holder 206 that is disposed above the chamber bottom 216. The substrate holders 204, 206 are generally mounted to a hoop 220 that is coupled to a shaft 282 that extends through the bottom 216 of the chamber body 202. Typically, each substrate holder 204, 206 is configured to retain one substrate. The shaft 282 is coupled to a lift mechanism 296 disposed exterior to the load lock chamber 122 that controls the elevation of the substrate holders 204, 206 within the chamber body 202. A bellows 284 is coupled between the hoop 220 and the bottom 216 of the chamber body 202 and disposed around the shaft 282 to provide a flexible seal between the second substrate holder 206 and the bottom 216, thus preventing leakage from or into the chamber body 202 and facilitating raising and lowing of the substrate holders 204, 206 without compromising the pressure within the load lock chamber 122.

The first substrate holder 204 is utilized to hold an unprocessed substrate from the factory interface 102 while the second substrate holder 206 is utilized to hold a processed substrate (e.g., an etched substrate) returning from the transfer chamber 136. The flow within the load lock chamber 122 during venting and evacuation is substantially laminar due to the position of the vent passage 230 and pump passage 232 and is configured to minimize particulate contamination.

Figure 3:
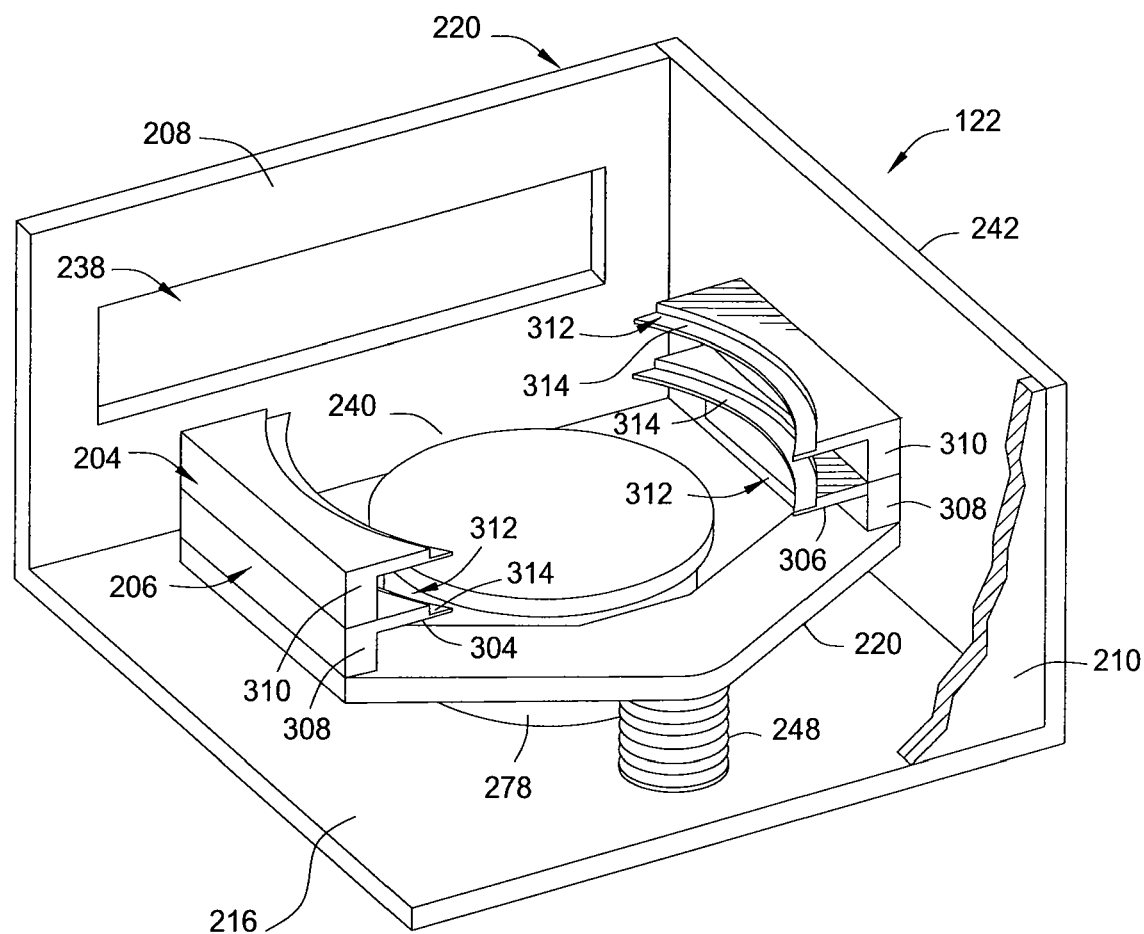
FIG. 3 depicts a sectional view of one embodiment of a heater module.

FIG. 3 depicts one embodiment of the substrate holders 204, 206 in the load lock chamber 122. The second substrate holder 206 is generally held above the bottom 216 of the chamber body 202 by the hoop 220. A first standoff 308 is disposed between each member 304, 306 to maintain the second substrate holder 206 in a spaced-apart relation to the hoop 220. A second standoff 310 is disposed between the first and second substrate holders 204, 206 to maintain a spaced-apart relation therebetween. The standoffs 308, 310 allow blades 134, 116 of the transfer and factory interface robots 130, 114 to pass therebetween when retrieving and depositing substrates on the substrate holders 204, 206. Each substrate holder 204, 206 includes a first member 304 and a second member 306. Each holder 204, 206 may have alternatively include a "L-shaped" configuration that incorporates a portion that maintains a spaced-apart relation between holder 204, 206 and adjacent components of the load lock chamber 122.

Each member 304, 306 includes a curved inner portion 312 that has a lip 314 extending radially inwards therefrom. The curved inner portion 312 is generally configured to allow the substrate 124 to pass therebetween and rest on the lip 314. The curved inner portion 312 captures the substrate 124 therebetween, thus preventing the substrate 124 from falling off the lip 314.

Referring back to FIG. 2, the temperature control pedestal 240 is coupled to the bottom 216 of the chamber body 202 by a support 278. The support 278 may be hollow or include passages therethrough to allow fluids, electrical signals, sensor and the like to be coupled to the pedestal 240. Alternatively, the pedestal 240 may be movably coupled to the chamber body 202 by a second shaft 282A and lift mechanism 296A. In that embodiment, the support 278 may include a bellows 284.

The temperature control pedestal 240 generally includes a platen 280 which is generally fabricated from a thermally conductive material such as aluminum or stainless steel, but may alternatively be comprised of other materials, such as ceramic. The platen 280 generally has a heat transfer element 286. The heat transfer element 286 may be a fluid passage disposed in the platen 280 or disposed in contact with a lower surface 288 of the platen 280. Alternatively, the heat transfer element 286 may be a circulated water jacket, a thermoelectric device, such as a Peltier device, or other structure that may be utilized to control the temperature of the platen 280.

In one embodiment, the heat transfer element 286 comprises a tube 290 disposed in contact with the lower surface 288 of the platen 280. The tube 290 is coupled to a fluid source 294 that circulates a fluid through the tube. The fluid, for example, facility water from the fluid source 294, may optionally be thermally regulated. The tube 290 may be disposed in a substantially circular or spiral pattern against the lower surface 288 of the platen 280. Typically, the tube 290 is brazed to or clamped against the lower surface 288 or adhered using a conductive adhesive. Optionally, a conductive plate (not shown), such as a copper plate may alternatively be disposed between the tube 290 and platen 280 to promote uniformity of heat transfer across the width of the platen 280. An alternative embodiment of the temperature control pedestal 240 is described below with reference to FIGS. 7-9.

The hoop 220 having the substrate holders 204, 206 coupled thereto maybe lowered to a first position where an upper surface 292 of the platen 280 is in close proximity or in contact with the substrate supported by the second substrate holder 206. In the first position, the platen 280 may be used to regulate the temperature of the substrate disposed on (or proximate to) the platen 280. For example, a substrate returning from processing may be cooled in the load lock chamber 122 by supporting the substrate during the evacuation of the load lock chamber 122 on the upper surface 292 of the platen 280. Thermal energy is transferred from the substrate through the platen 280 to the heat transfer element 286, thereby cooling the substrate. After cooling the substrate, the substrate holders 204, 206 may be raised towards the top 214 of the chamber body 202 to allow the robots 130, 114 to access to the substrate seated in the second substrate holder 206. Optionally, the holders 204, 206 may be lowered to a position where the upper surface 292 is in contact or close proximity to the substrate supported by the first substrate holder 204. In this position, the platen 280 may be used to thermally regulate and heat the substrate. An alternative embodiment of the substrate holders 204,206 is described below with reference to FIGS. 10-12.

Figure 9:
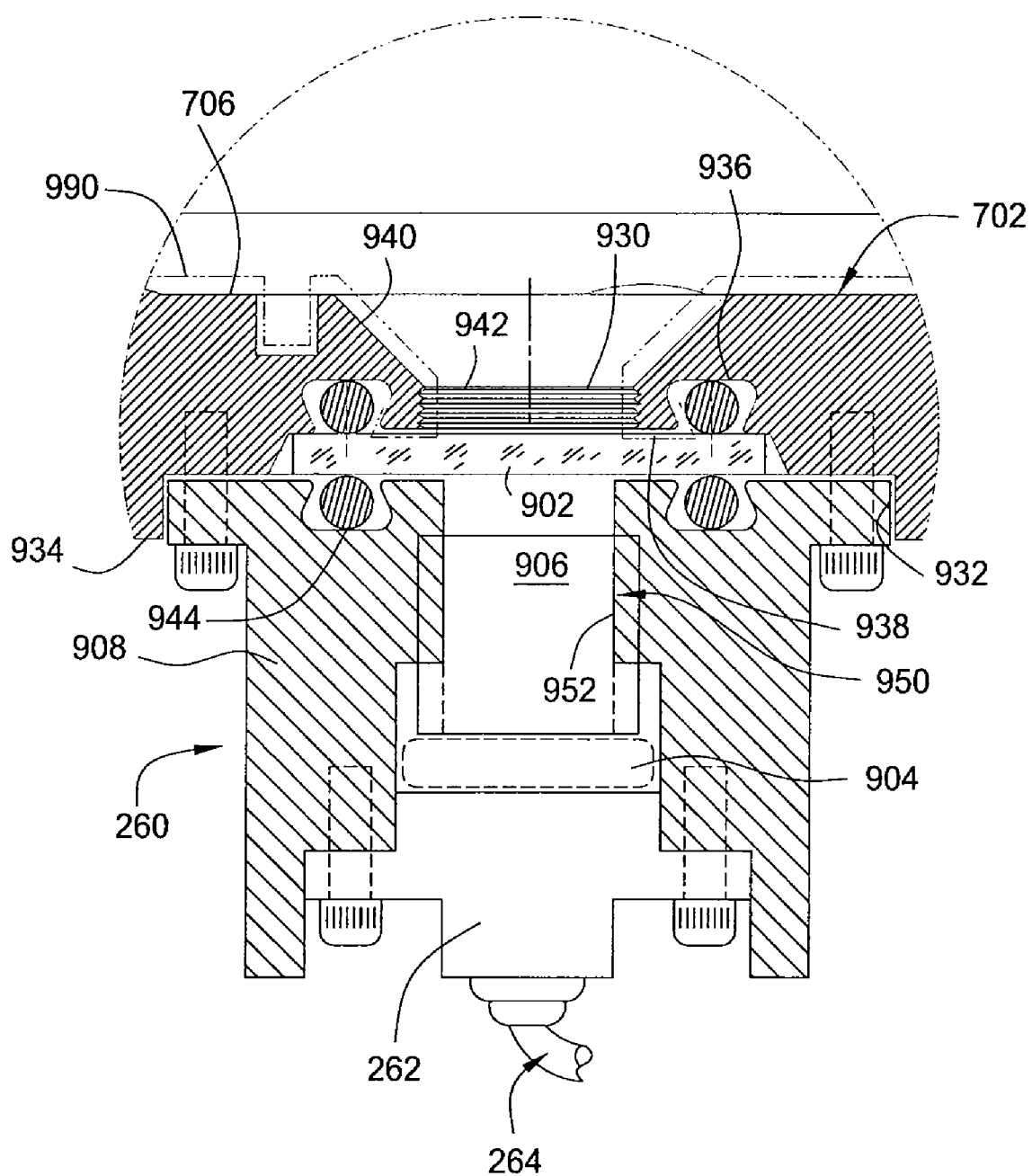
FIG. 9 is another partial sectional view of the temperature control pedestal of FIG. 7 illustrating an optics termination.

In one embodiment, the temperature control pedestal 240 includes an optical termination 262 that is coupled to a sensor 268 for determining the temperature of the substrate disposed on the pedestal 240. The optical termination 262 allows optical information to be provided to the sensor 268 via an optical conduit InposelstartInposelend264, such as a fiber optic cable. The optical termination 262 may include a window, filter, optical transfer device. One embodiment of an optical termination 262 is illustrated in FIG. 9, which is described in greater detail below.

In one embodiment, a plurality of lamps 260 is disposed in the heater module 270 to generate heat for thermal processing the substrate while on the pedestal 240. In one embodiment, the lamps 260 are quartz halogen lamps providing infrared radiation having a wavelength between about 700 nm and about 14000 nm. The infrared radiation generated from the lamps 260 may provide heat to the substrate and increase the substrate temperature up to about 500 degrees Celsius. Generally, the wavelength of the sensor 268 is selected to have a high change in transmittance through the materials and/or films being heated in the range of temperature for which measurement is sought, for example, a temperature of a thermal process endpoint.

In one embodiment, the sensor 268 is an InGaAs diode sensor adapted to measure a substrate temperature range between 100 degrees Celsius and about 500 degrees Celsius. The sensor 268 is optically aligned with the optical transfer device and the filter. The optical transfer device is disposed in the pedestal 240 between an end of the optical conduit 264 and the substrate. The optical conduit 264 detects collected energy passing through substrate and optical transfer device to the filter. The filter is adapted to filter the signal collected from the optical transfer device and only provides IR light with a desired wavelength to the sensor 268.

In one embodiment, the optical transfer device, such as a collimator, has an aperture selected to allow energy to enter the optical conduit 264 which is incident to the substrate at a predefined angle selected to minimize the entry of scattered energy and other noise into the conduit 264. For example, the selected angle of the optical transfer device only allows light passing through the substrate at within a cone defined by the angle to be collected, and prevents light incident at to the substrate at angles outside of the selected angle from entering into the optical conduit 264. The unwanted reflected light from the chamber wall and/or noise generated from the background may be prevented from interfering with the signal entering to optical conduit 264 through the optical transfer device and ultimately reaching the sensor 268 through the filter. The light energy reaching to the sensor 268 is then further analyzed to calculate the temperature of the substrate 124.

In another embodiment, the optical transfer device may be a wide angle or fish-eye lens which collects and transfers more energy to the sensor 268. This is particularly useful in embodiments where the substrate does not allow energy to pass through the substrate efficiently, thus allowing for compensation for low signal strength (e.g. poor energy transmission through the substrate.)

Figure 4:
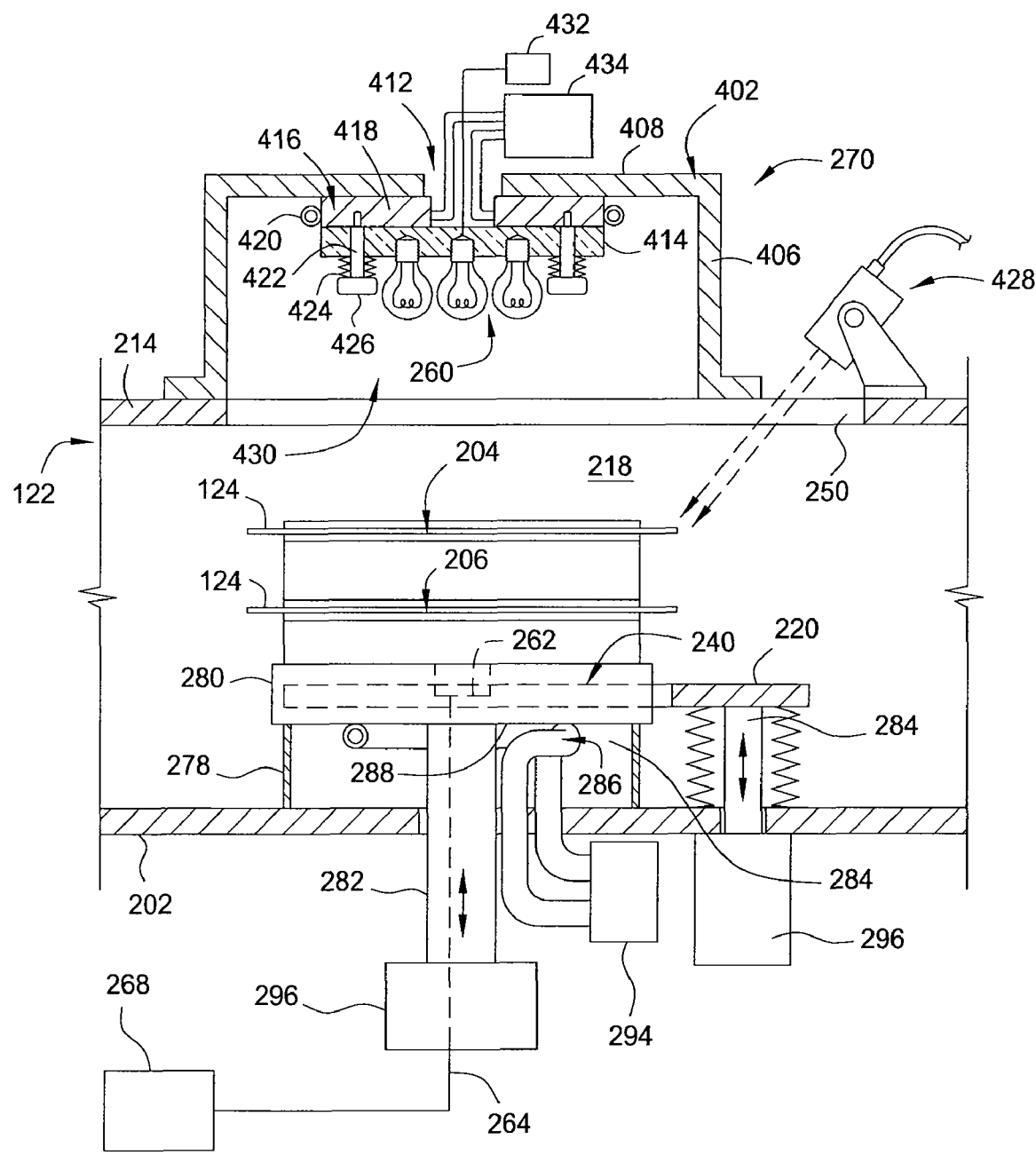
FIG. 4 depicts a sectional view of another embodiment of a load lock chamber.

FIG. 4 depicts a sectional view of one embodiment of the heater module 270. The heater module 270 is generally disposed on the top 214 of the load lock chamber 122. The heater module 270 may alternatively comprise various types of radiant heaters. In one embodiment, the heater module 270 includes a housing 402 having one or more lamps 260 disposed therein. The housing 402 generally includes sides 406 and a top 408 that define an interior 430. The sides 406 are generally coupled to the top of the chamber body 202. An aperture 412 is formed in the top 408 of the heater module 270 to facilitate power connection to the lamp 260. The lamp 402 is generally coupled to a power source 432 by a ceramic socket 414.

A cooling device 416 is coupled to the socket 414 to control the temperature of the lamps 260, thereby extending the life of the lamps 260. In one embodiment, the cooling device 416 is an annular plate 418 having good thermal conductivity that is thermally regulated by a circulating fluid. In one embodiment, the annular plate 418 is a copper disk having a tube 420 brazed to the perimeter of the plate 418. The fluid is circulated through the tube 420 from a fluid source 434, thereby regulating the temperature of the plate 418. Alternatively, the cooling device 416 may include thermoelectric devices, heat sinks, water jackets and other devices that limit the temperature rise of the socket 414.

The socket 414 is typically biased against the plate 418 to promote heat transfer therebetween. In one embodiment, a shoulder screw 422 is disposed through the socket 414 and plate 418 and threads into the top 408 of the housing 402. To accommodate thermal expansion between the socket 414 and plate 418, one or more springs 424 may be disposed between a head 426 of the shoulder screw 422 and the socket 414. The spring 424, which may be a coil, flat, belliville or other basising device, maintains contact between the socket 414 and plate 418 over a wide range of temperature without damaging the socket 414.

Optionally, a metrology device 428 may be disposed proximate the window 250. In one embodiment, the metrology device 428 may be a residual gas analyzer (RGA). The RGA detects the exhaust gases in the load lock chamber 122 and indicates the ions and species included in the exhaust gas released from the substrate surface. The released exhaust gas ions and species reflect the amount of halogen-containing residues remaining on the substrate surface, thereby determining an end point for the halogen-containing residue removal process. In another embodiment, the metrology device 428 may be other types of optical end point detection system that facilitates for determination of an end point for the halogen-containing residue removal process. Alternatively, the metrology device 428 may be a substrate type sensor, a substrate orientation sensor, a substrate center sensor, a substrate location sensor, a film thickness detector, a topography detector or other device utilized to detect attributes of the substrate disposed in the load lock chamber 122. Generally, the metrology device 428 is disposed proximate the heater module 270 and positioned to view the substrate through the window 250. Alternatively, the metrology device 428 may be disposed in the heater module 270 or in the chamber volume 218.

Referring back to FIG. 2, in operation, the load lock chamber 122 facilitates the transfer of substrates between the ambient atmosphere of the factory interface 102 and the vacuum atmosphere of the transfer chamber 136. The load lock chamber 122 temporarily houses the substrate while the atmosphere within the load lock chamber 122 is adjusted to match the atmosphere of the transfer chamber 136 or factory interface 102 into which the substrate is to be transferred. For example, the first slit valve 244 is opened while the load lock chamber 122 is vented to substantially atmospheric pressure to match the atmosphere of the factory interface 102. The factory interface robot 114 transfers an unprocessed substrate from one of the FOUP 106A-B to the first substrate holder 204. The substrate subsequently transfers to the processing chambers 110, 112, 132, 128, 120 to perform an etch process. After the halogen comprising etch process is completed, the pump passage 232 in the load lock chamber 122 is subsequently opened and the load lock chamber 122 is pumped down to the pressure substantially equal to the pressure of the transfer chamber 136. Once the pressures within the load lock chamber 122 and transfer chamber 136 are substantially equal, the second slit valve 246 is opened. The processed substrate is transferred to position on the second substrate holder 206 by the transfer robot 130 in the load lock chamber 122. The second slit valve 246 is closed once the blade of the transfer robot 130 is removed.

During halogen-containing residue removal process, the second substrate holder 206 may be raised the processed substrate toward the heater module 270 to increase heating efficiency, thereby converting the halogen-containing residues to non-volatile compounds that may be pumped out of the load lock chamber 122. During the removal process, one or more process gases may be supplied into the load lock chamber 122 to promote halogen removal as further discussed below. After the halogen-containing residues on the processed substrate surface has been partially or totally outgassed from the substrate surface, the vent passage 230 is opened in the load lock chamber 122 to allow the pressure in the load lock chamber 122 to raise to substantially match the pressure in the factory interface 102, thereby facilitating the processed substrate being transferred to the FOUPs 106A-B. While venting, the pedestal 240 is raised to contact the processed substrate rest on the second substrate holder 206. The processed substrate is thus cooled by transferring heat through the pedestal 240 to the fluid circulating in the tube 290. Once the pressures are matched, the first slit valve 244 is opened to allow the factory interface robot 114 to access the load lock chamber 122 to remove the processed substrate from the second substrate holder 206 and return to one of the FOUPs 106A-B. As such, as the substrate cooling process and the load lock chamber venting process is performed simultaneously, the overall process period and cycle time is reduced and productivity and throughput is increased. A newly unprocessed substrate from the FOUPs 106A-B may be transferred into the load lock chamber 122 on the first substrate holder 204 as the processed substrate removed from the second substrate holder 206 by the factory interface robot 114 while the slit valve 244 the load lock chamber 122 remains opened.

After completion of the substrate transfer, the first slit valve 244 and vent passage 230 are closed. The pump passage 232 is subsequently opened and the load lock chamber 122 is pumped down to the pressure substantially equal to the pressure of the transfer chamber 136. Once the pressure of the load lock chamber 122 and the transfer chamber 136 are substantially equal, the second slit valve 246 is opened and the transfer robot 130 then retrieves the newly unprocessed substrate for position in the first substrate holder 204 for processing in one or more of the process chambers 110, 112, 132, 128, 120 circumscribing the transfer chamber 136 to repeatedly and consecutively perform the etch process and halogen-containing residue removal process as stated above. After substrate transfer is completed, the second slit valve 246 is closed to seal the load lock chamber 122 from the transfer chamber 136 as stated above.

Figure 5:
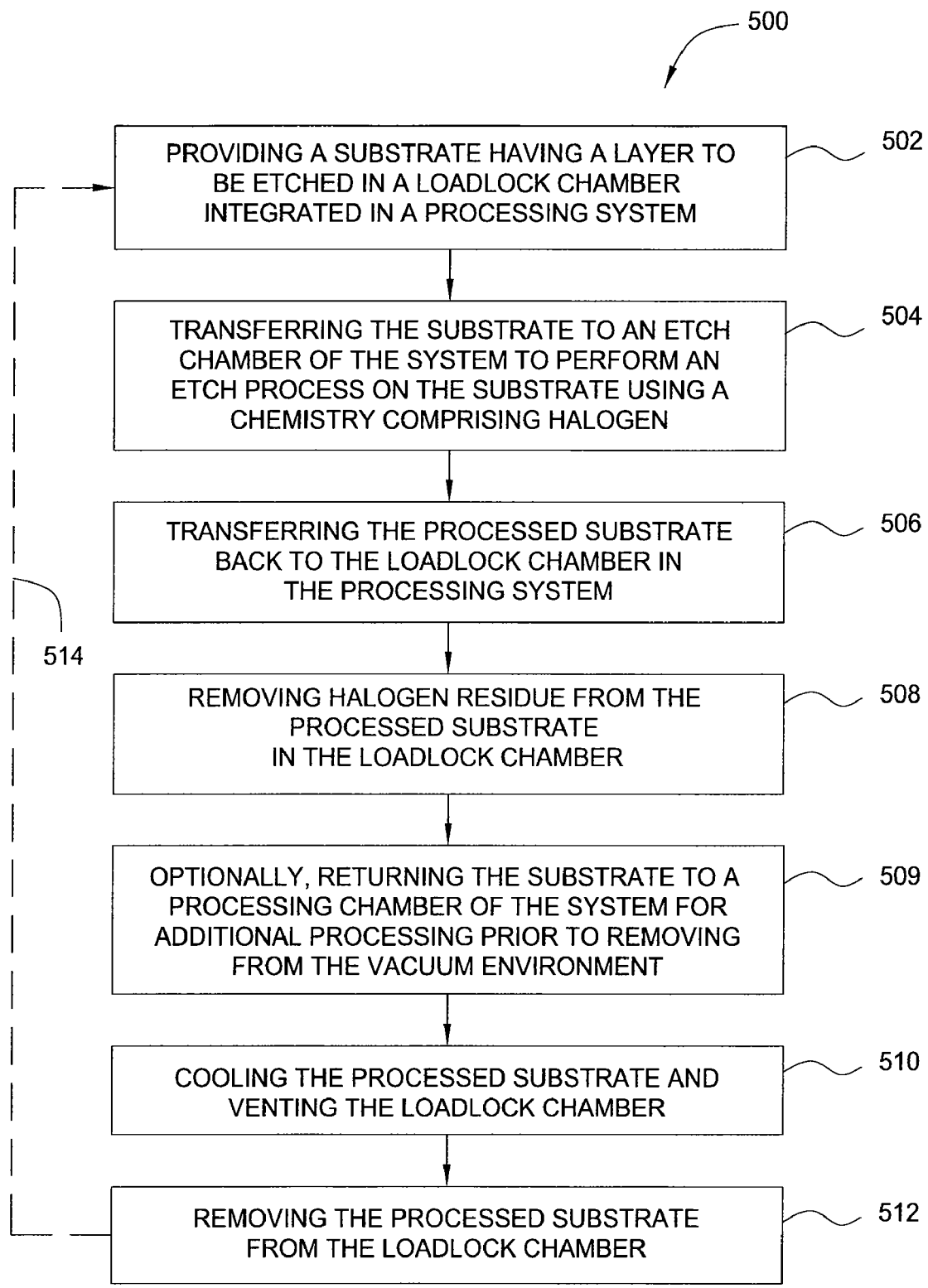
FIG. 5 depicts a process diagram illustrating a method for removing halogen-containing residues on a substrate according to one embodiment of the present invention.

FIG. 5 depicts a flow diagram of a method 500 for removing a halogen-containing residue from a substrate in accordance with the present invention. The method 500 is configured to perform at the processing system 100 as described in FIG. 1. It is contemplated that the method 500 may be performed in other suitable processing systems, including those from other manufacturers.

The method 500 begins at step 502 by providing a substrate having a layer disposed thereon which is to be etched in the processing system 100. The factory interface robot 114 transfers the substrate to be processed from one of the FOUPs 106A-B to the first substrate holder 204 in the load lock chamber 122. The substrate may be any substrate or material surface upon which film processing is performed. In one embodiment, the substrate may have a layer or layers formed thereon utilized to form a structure, such as a gate structure. The substrate may alternatively utilize a mask layer as an etch mask and/or etch stop layer disposed on the substrate to promote the transfer of the features or structures to the substrate. In another embodiment, the substrate may have multiple layers, e.g., a film stack, utilized to form different patterns and/or features, such as dual damascene structure and the like. The substrate may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire, metal layers disposed on silicon and the like. The substrate may have various dimensions, such as 200 mm or 300 mm diameter wafers, as well as, rectangular or square panels.

In one embodiment, the substrate transferred to the load lock chamber 122 may be preheated to a predetermined temperature by the heater module 270 or by the temperature controlled pedestal 240 in the load lock chamber 122. In one embodiment, the substrate may be preheated to a temperature between about 20 degrees Celsius and about 400 degrees Celsius.

At step 504, after the pressure within the load lock chamber 122 and the transfer chamber 136 are substantially equal, the vacuum robot 130 transfers the substrate to one of the processing chambers 110, 112, 132, 128, 120. The substrate is etched in one of the processing chamber 110, 112, 132, 128, 120 to form desired features and patterns on the substrate. In embodiments which the substrate has mask layers disposed on the substrate surface, the etch process etches the mask layers simultaneously while forming the desired features and patterns.

In one embodiment, the substrate is etched in one of the processing chambers 110, 112, 132, 128, 120 by supplying a gas mixture having at least a halogen-containing gas. Suitable examples of halogen-containing gas include, but not limited to, hydrogen bromide (HBr), chlorine ($Cl_2$), carbon tetrafluoride ($CF_4$), and the like. In an exemplary embodiment suitable for etching polysilicon, the gas mixture supplied to the processing chamber 110, 112, 132, 128, 120 provides a gas mixture including hydrogen bromide (HBr) and chlorine ($Cl_2$) gas at a flow rate between about 20 sccm and about 300 sccm, such as between 20 sccm and about 60 sccm, for example about 40 sccm. The hydrogen bromide (HBr) and chlorine ($Cl_2$) gas may have a gas ratio ranging between about 1:0 and about 1:30, such as about 1:15. An inert gas may be supplied with the gas mixture to the processing chamber 110, 112, 132, 128, 120. Suitable examples of inert gas may include nitrogen ($N_2$), argon (Ar), helium (He) and the like. In one embodiment, the inert gas, such as $N_2$, may supplied with the gas mixture at a flow rate between about 0 sccm and about 200 sccm, such as between about 0 sccm and about 40 sccm, for example about 20 sccm. A reducing gas, such as carbon monoxide (CO) may be supplied with the gas mixture. The plasma power for the etch process may be maintained between about 200 Watts and about 3000 Watts, such as about 500 Watts and about 1500 Watts, for example about 1100 Watts, and the bias power may be maintained between about 0 Watts and about 300 Watts, such as about 0 Watts and about 80 Watts, for example about 20 Watts. The process pressure may be controlled at between about 2 mTorr and about 100 mTorr, such as between about 2 mTorr and about 20 mTorr, for example about 4 mTorr, and the substrate temperature may be maintained at between about 0 degrees Celsius and about 200 degrees Celsius, such as between about 0 degrees Celsius and about 100 degrees Celsius, for example about 45 degrees Celsius.

During etching process, the etched materials may combine with the components of the etchant chemistry, as well as with the components of the mask layers, if any, and by-products of the etch process, thereby forming halogen-containing residues. In one embodiment, the materials on the substrate to be etched may include photoresist layer, hard mask layer, bottom anti-reflective coating (BARC), polysilicon, crystalline silicon, gate oxide, metal gate, such as Titanium nitride (TiN), and high-k materials, such as aluminum oxide ($Al_2O_3$), hafnium containing oxide. Suitable examples of hard mask layer include silicon nitride, TEOS, silicon oxide, amorphous carbon, and silicon carbide. The halogen-containing residues deposit on the surfaces of the substrate. The halogen-containing residue may release (e.g., outgas) gaseous reactants, such as bromine ($Br_2$), chlorine ($Cl_2$), hydrogen chloride (HCl), hydrogen bromine (HBr) and the like, if exposed to atmospheric pressures and/or water vapor. The release of such reactants may cause corrosions and particle contamination of the processing apparatus and factory interfaces during substrate transfer, such as the vacuum-tight processing platform 104 and the factory interface 102 as described in FIG. 1. In embodiments where metallic layers, such as Cu, Al, W, are exposed to the substrate surface, the metallic layer may be corroded by the released gaseous reactants if they are not removed by the inventive process described below, thereby adversely deteriorating the performance of devices formed on the substrate.

Halogens may also be present on the surface of substrates that are processed in a vacuum environment in a manner other than etching. Therefore, it is contemplated that halogens may be removed from those substrates using the method and apparatus described herein.

At step 506, the processed (e.g., etched) substrate is transferred to the load lock chamber 122 to remove the halogen-containing residues from the substrate generated during step 504 prior to exposure to atmospheric conditions or water vapor in the factory interface or other location. After etch processing, the vacuum robot 130 in the transfer chamber 136 transfers the etched substrate from one of the processing chambers 110, 112, 132, 128, 120 to the second substrate holder 206 in the load lock chamber 122.

At step 508, a thermal treatment process is performed on the etched substrate to remove the halogen-containing residues on the etched substrate surface. The etched substrate held by the second substrate holder 206 raises the substrate 124 toward the heater module 270, thereby increasing the intensity of heat transfer to the substrate. The heat from the heater module 270 causes the temperature of the surface of the substrate to rise, thereby causing halogen-based reactants disposed on the etched substrate surface to be released and/or outgassed. The heater module 270 heats the substrate to a temperature between about 20 degrees Celsius and about 400 degrees Celsius, such as between about 150 degrees Celsius and about 300 degrees Celsius, for example about 250 degrees Celsius, at between about 5 seconds and about 30 seconds. The rapid heating of the substrate by heater module 270 allows the halogen-containing residues on the etched substrate to be removed without increasing process cycle time which would be encountered if the residues were removed in one if the processing chambers. In one embodiment, the substrate may be heated by the heater module 270 at a predetermined time period until the halogen-containing residues on the etched substrate are removed therefrom. The time or endpoint may be determined using the metrology device 428. The etched substrate may be heated at a temperature between about 150 degrees Celsius and about 300 degrees Celsius, such as 250 degrees Celsius for between about 10 seconds to about 120 seconds, such as between about 30 seconds to about 90 seconds.

In one embodiment, a gas mixture may be supplied from the gas source 252 to the load lock chamber 122 while heating the etched substrate. The etched substrate is exposed to and reacts with the gas mixture. The gas mixture converts the outgassed halogen-based reactants into non-corrosive volatile compounds that are pumped out of the load lock chamber 122. The gas mixture may include an oxygen-containing gas, such as $O_2$, $O_3$, water vapor ($H_2O$), a hydrogen-containing gas, such as $H_2$, forming gas, water vapor ($H_2O$), alkanes, alkenes, and the like, or an inert gas, such as a nitrogen gas ($N_2$), argon (Ar), helium (He), and the like. For example, the gas mixture may include oxygen, nitrogen, and a hydrogen-containing gas. In one embodiment, the hydrogen-containing gas is at least one of hydrogen ($H_2$) and water vapor ($H_2O$). In embodiments which mask layers is present on the substrate, the mask layers may be simultaneously removed with the halogen-containing residues, e.g., the mask is stripped of the photoresist in the load lock chamber.

In one embodiment, the gas mixture may be supplied at a flow rate between about 100 sccm and about 5000 sccm, such as between about 200 sccm and about 1000 sccm, for example about 300 sccm. Alternatively, the gas mixture, for example, may be an $O_2$ and $N_2$ gas mixture supplied at a gas ratio between about 1:1 and about 20:1, such as between about 10:1. The pressure of the load lock chamber 122 may be maintained at between about 10 mTorr and about 5000 mTorr, such as, between about 100 mTorr and about 1000 mTorr, for example, about 300 mTorr. In embodiments where the halogen-containing residues are mostly chlorine-based residues resulting from use of chlorine-based etching chemistry, the gas mixture may be oxygen gas ($O_2$) and/or hydrogen containing gas, such as water vapor ($H_2O$) and/or $H_2$. The oxygen gas ($O_2$) may be supplied at a flow rate at between about 100 sccm and about 5000 sccm and hydrogen containing gas, such as water vapor ($H_2O$) and/or $H_2$ may be supplied at a flow rate at between about 100 sccm and about 3000 sccm. Alternatively, the oxygen gas ($O_2$) and hydrogen containing gas, such as water vapor ($H_2O$) and/or $H_2$, may be supplied at a ratio between about 200:1 and about 1:1, such as about 150:1 and about 5:1. Alternatively, the gas mixture may be an oxygen gas or a pure hydrogen containing gas, such as water vapor ($H_2O$). A residual gas analyzer (RGA), such as the metrology device 428 as described in FIG. 4, may be utilized to detect the remaining halogen-containing residues on the etched substrate surface.

In an alternative embodiment, the gas mixture may be provided to the interior of the load lock chamber 122 through a remote plasma source, such as the remote plasma source 248 in FIG. 2. The remote plasma source ionizes the gas mixture. The dissociated ions and species promote the conversion of the outgassed halogen-based reactants into non-corrosive volatile compounds, thereby increasing the removal efficiency of the halogen-containing residues from the etched substrate surface. In one embodiment, the remote plasma source may provide a plasma power at between about 500 Watts and 6000 Watts. In embodiments where the plasma is present, an inert gas, such as Ar, He or $N_2$, may be supplied with the gas mixture.

Optionally, a step 509 may be performed wherein the substrate is returned to one of the processing chamber 110, 112, 132, 128, 120 of the system for additional processing prior to removing from the vacuum environment. The substrate, after the halogen removal process of step 508, will not introduce halogens into the processing chambers during subsequent processing, thereby preventing damage to the processing chambers.

At step 510, the temperature control pedestal 240 is raised to contact the etched substrate supported on the second substrate holder 206 after the halogen residue removal step 508 to cool the substrate to a desired temperature. The etched substrate is cooled by transferring heat through the pedestal 240 to the fluid circulating in the tube 290. In one embodiment, the etched substrate may be cooled to a temperature ranging between about 10 degrees Celsius and about 125 degrees Celsius that allows the etched substrate returning to the FOUPs 106A-B without causing damage to the FOUPs 106A-B.

Alternatively, at step 510 the temperature control pedestal 240 cools the etched substrate supported on the second substrate holder 206 after the halogen residue removal step 508 to cool the substrate to a first temperature which is too great to be placed in the FOUP, for example, a temperature greater than about 125 degrees Celsius. Alternative step 510 would include removing the still hot substrate from the load lock chamber 122 and placing substrate in the substrate holder 182 for a predetermined period of time until the substrate reaches a second temperature which is low enough to be placed in the FOUP, for example, a temperature less than about 125 degrees Celsius. In one embodiment, the substrate is set in the substrate holder 182 to cool for about 20-30 second.

While cooling the substrate at step 510, the load lock chamber 122 may be simultaneously vented in preparation for the subsequent substrate transfer process at step 512 to minimize process cycle time. Once the pressures of the load lock chamber 122 and the factory interface 102 are matched, the first slit valve 244 is opened to allow the factory interface robot 114 to access the load lock chamber 122 to remove the etched substrate from the load lock chamber 122 and return to one of the FOUPs 106A-B. A newly unprocessed substrate from the FOUPs 106A-B may be transferred into the load lock chamber 122 on the first substrate holder 204 while the etched substrate is removed from the second substrate holder 206, thereby repeatedly and consecutively processing substrates as indicated by the loop 514 depicted in FIG. 5.

Figure 6:
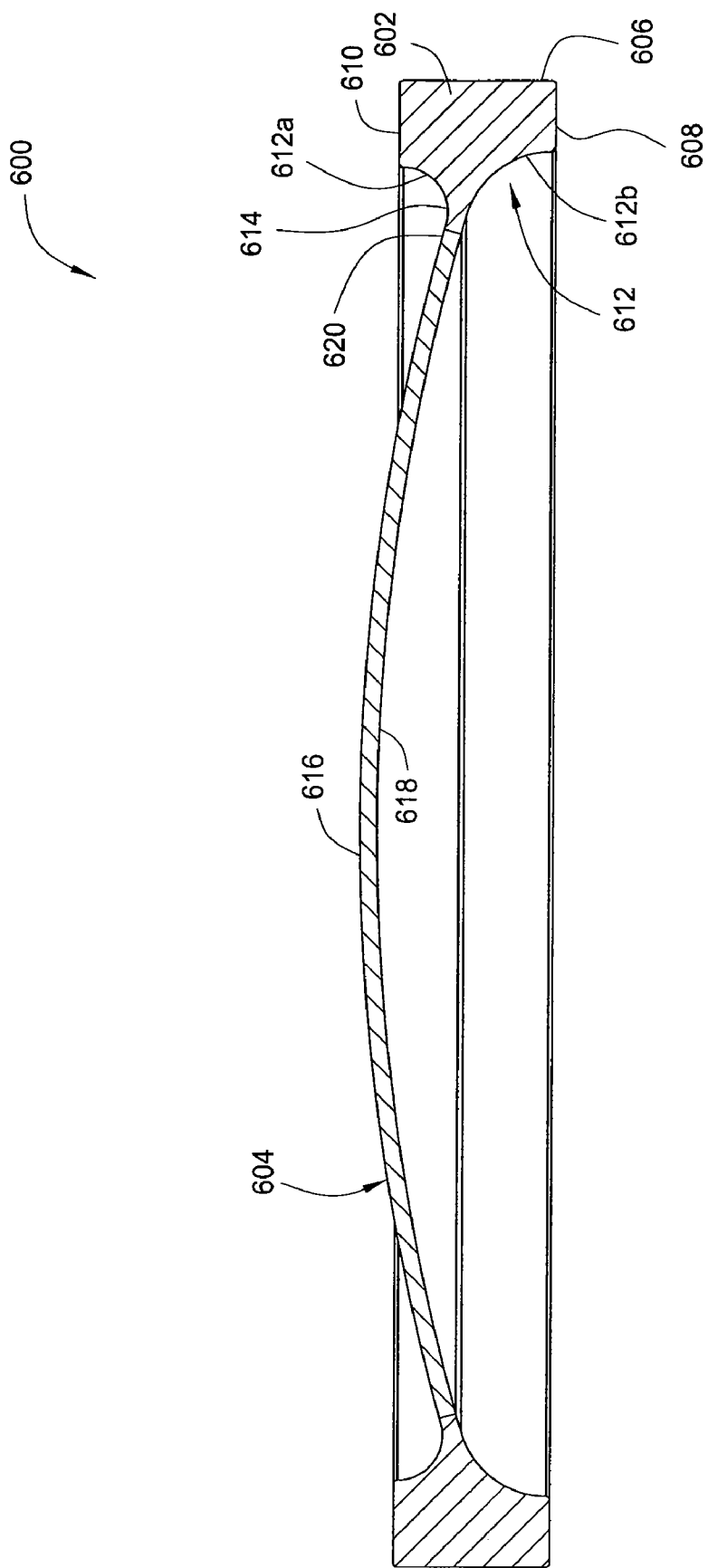
FIG. 6 depicts a sectional view of one embodiment of a window that may be utilized in the load lock chamber of FIG. 2, among other vacuum chambers.

FIG. 6 depicts a sectional view of one embodiment of a window 600 that may be utilized in the load lock chamber 122 of FIG. 2, among other vacuum chambers. The window 600 includes a ring 602 coupled to a convex member 604. The ring 602 and the convex member 604 may be fabricated from clear quartz or other suitable material. In one embodiment, peripheral portions of the ring 602 may be fabricated from frosted white quartz or other suitable opaque material to shield an underlying o-ring from light emitted from the plurality of lamps 260, thereby reducing degradation from radiation heating on the o-ring. The window 600 may be fire polished prior to annealing. In one embodiment, the ring 602 is fused to the convex member 604 to provide a vacuum tight seal therebetween.

The ring 602 generally includes an inside edge 612, an outside edge 606, a top 610 and a bottom 608. The inside edge 612 includes a lip 614 that extends radially inward between upper and lower sections 612a, 612b of the edge 612. The upper and lower sections 612a, 612b of the edge 612 have a large radius that provides structural support for the lip 614. The radius of the lower section 612b may be greater than that of the upper section 612a. The lip 614 is angled upward and inward and provides a fastening surface for coupling the ring 602 to the convex member 604. In one embodiment, the bottom 608 is in sealing contact with an o-ring to prevent leakage past the window 600.

The convex member 604 includes a top 616 and a bottom 618 joined at an outer edge 620. The outer edge 620 is fused or otherwise sealingly fastened to the lip 614 of the ring 602. The curvature of the top 616 and the bottom 618 and thickness of the convex member 604 are selected to withstand vacuum levels commonly utilized in load lock chambers of semiconductor processing systems. In one embodiment, the top 616 of the convex member 604 extends to an elevation beyond the top 610 of the ring 602.

Figure 7:
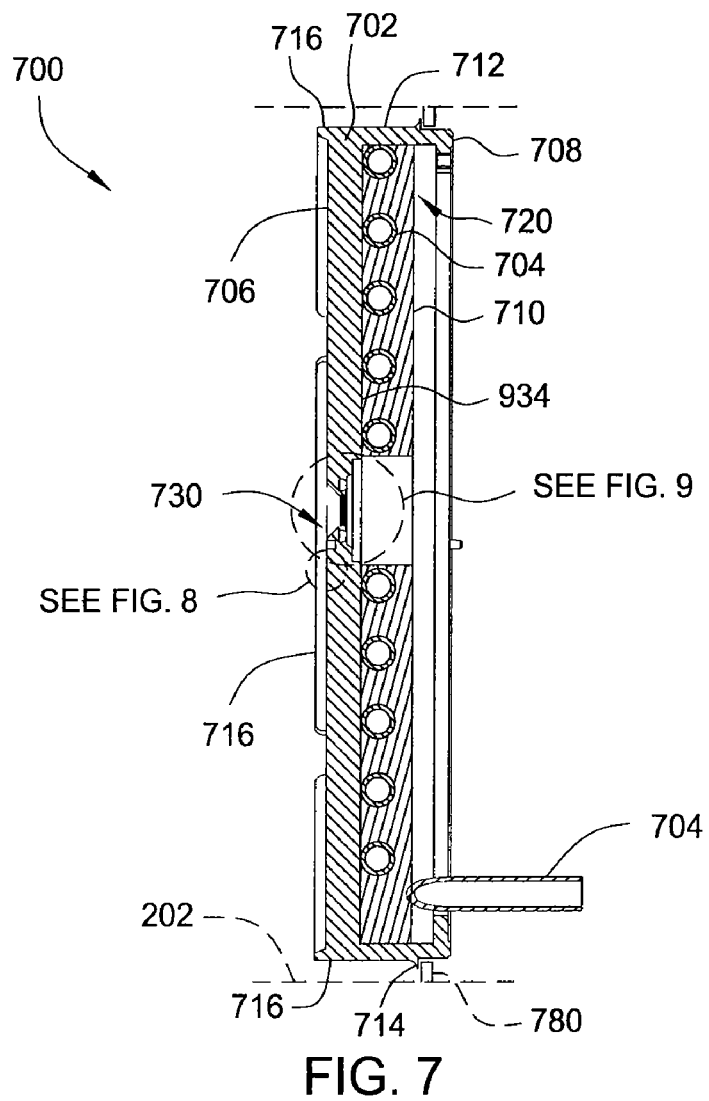
FIG. 7 depicts a sectional view of one embodiment of a temperature control pedestal that may be utilized in the load lock chamber of FIG. 2, among other vacuum chambers.

FIG. 7 depicts a sectional view of one embodiment of a temperature control pedestal 700 that may be utilized in the load lock chamber 122 of FIG. 2, among other vacuum chambers. The temperature control pedestal 700 includes a base 702 and a cooling coil 704. The base 702 may be fabricated from aluminum or other suitable material, and has a top surface 706 for supporting the substrate, a bottom surface 708 and an outer wall 712.

The outer wall 712 defines the outer diameter of the base 702 and has a small projection 714 extending therefrom. The projection 714 may be in the form of a continuous or intermittent lip or other geometric projection that is suitable for supporting the temperature control pedestal 700 on a ledge 780 formed in the chamber body 202. The projection 714 is utilized to thermally isolate the base 702 from the chamber body 202. The projection 714 enables the temperature control pedestal 700 to be efficiently maintained at or below 25 degrees Celsius while the walls of the chamber body 202 are maintained in excess of 50 degrees Celsius, for example, at a temperature differential of about 25 degrees Celsius. The ability to maintain the temperature differential allows for the chamber body 202 to be held at an elevated temperature that minimizes the deposition of material thereon, while still allowing good cooling of the substrate positioned on the pedestal 700. In one embodiment, the projection 714 is a substantially triangular form.

Figure 8:
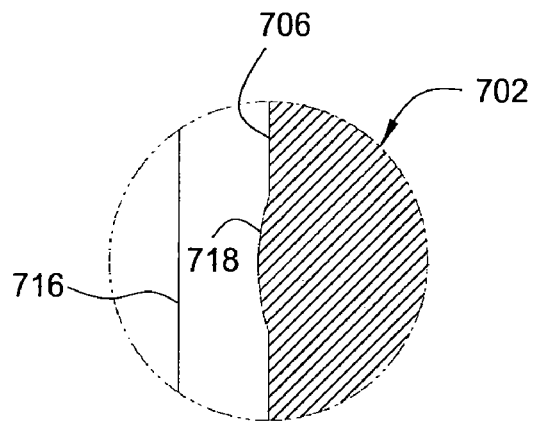
FIG. 8 is a partial sectional view of the temperature control pedestal of FIG. 7 illustrating a substrate spacer.

The top surface 706 of the temperature control pedestal 700 includes a raised rim 716 and a plurality of substrate spacers 718 (shown in FIG. 8). The raised rim 716 is positioned at the outer wall 712 of the base 702. The raised rim 716 may be in the form of a continuous or intermittent lip or other geometric projection that is suitable for maintaining and/or centering the substrate on the top surface 706. The substrate spacers 718 project a small distance from the top surface 706 as not to overly hinder the heat transfer between the top surface 706 and the substrate positioned on the spacers 718. In one embodiment, the substrate spacers 718 are in the form of domes.

The coil 704 is housed in a recess 720 formed in the bottom surface 708 of the base 702. The coil 704 may be secured in the recess 720 by a potting material 710. Alternatively, the coil 704 may be secured in the recess 720 by fasteners, a clamp or other means that allows good heat transfer between the coil 704 and base 702.

The base 702 of the temperature control pedestal 700 also includes a mounting feature 730 configured to accept an optical termination 262. The optical termination 262 facilitates securing optical information that may be utilized to determine the temperature of the substrate positioned on the temperature control pedestal 700. The mounting feature 730 may be positioned offset from the centerline of the base 702.

FIG. 9 is a partial sectional view illustrating one embodiment of the optical termination 262 mated with the mounting feature 730 of the base 702. The optical termination 262 includes a window 902, an optional filter 904, an optical transfer device 906 and an adapter 908. The optical transfer device 906 may be an optical collimator or a lens, such as a wide angle or fish-eye lens.

The adapter 908 retains at least the optional filter 904 and optical transfer device 906 to the base 702. In one embodiment, the mounting feature 730 includes an aperture 930 which opens into a stepped recess 932 formed on a bottom surface 934 of the recess 720. An o-ring gland 936 is formed in a bottom surface 934 of the stepped recess 932. The top surface 706 of the base 702 may include a countersink 940 which opens into the aperture 930 to facility light entry. The countersink 940 has a countersink angle larger than 10 degrees. In one embodiment, the countersink angle is 45 degrees or greater. A wide countersink angle promotes capture of large amounts of light for increased signal strength. Substrates comprising light-absorbent materials, such as carbon films may absorb a substantial amount of light, thus reducing the amount of light entering the aperture 930. The wide countersink angle advantageously enables the entry of additional light traveling through the substrate into the aperture 930, thus resulting in an increased signal strength which can compensate for poor light transmission through the substrate. The aperture 930 may also include a rough surface feature, such as a plurality of ridges 942 formed in wall of base 702 defining the aperture 930, to improve the capture of desired light. The plurality of ridges 942 reduces the reflectance of light within the aperture 930.

The optical termination 262 is screwed or clamped to the base 702 such that o-rings disposed in the gland 936 of the base 702 and in a gland 944 of the adapter 908 creates a gas-tight seal around the window 902 spanning the aperture 930. The window 902 may be quartz, sapphire or other suitable material.

The optical termination 262 includes a center passage 950 in which the end of the optical conduit 264, the optional filter 904 and the optical transfer device 906 are secured. In one embodiment, the center passage 950 includes a first threaded section 952 which engages the optical transfer device 906 in a position proximate the window 902.

The close position of the optical transfer device 906 to the aperture 930 provides a greater capture angle for incident light. The end of the optical conduit 264 may be secured to the adapter 908 via clamps, fasteners that engage threaded holes in the adapter 908 or the end of the optical conduit 264 may thread directly into the center passage 950 of the adapter 908. In another embodiment, the optical filter 904 is coupled at the end of the optical conduit 264. The optical filter 904 is engaged to a diode sensor, the sensor capable of reading optical information that may be utilized to determine the temperature of the substrate positioned on the temperature control pedestal 700.

Also shown in FIG. 9 is an anodized coating 990 that covers the top surface 706 of the base 702, aperture 930 and portion of the bottom surface 934 of the stepped recess 932 up to the gland 936.

Figure 10:
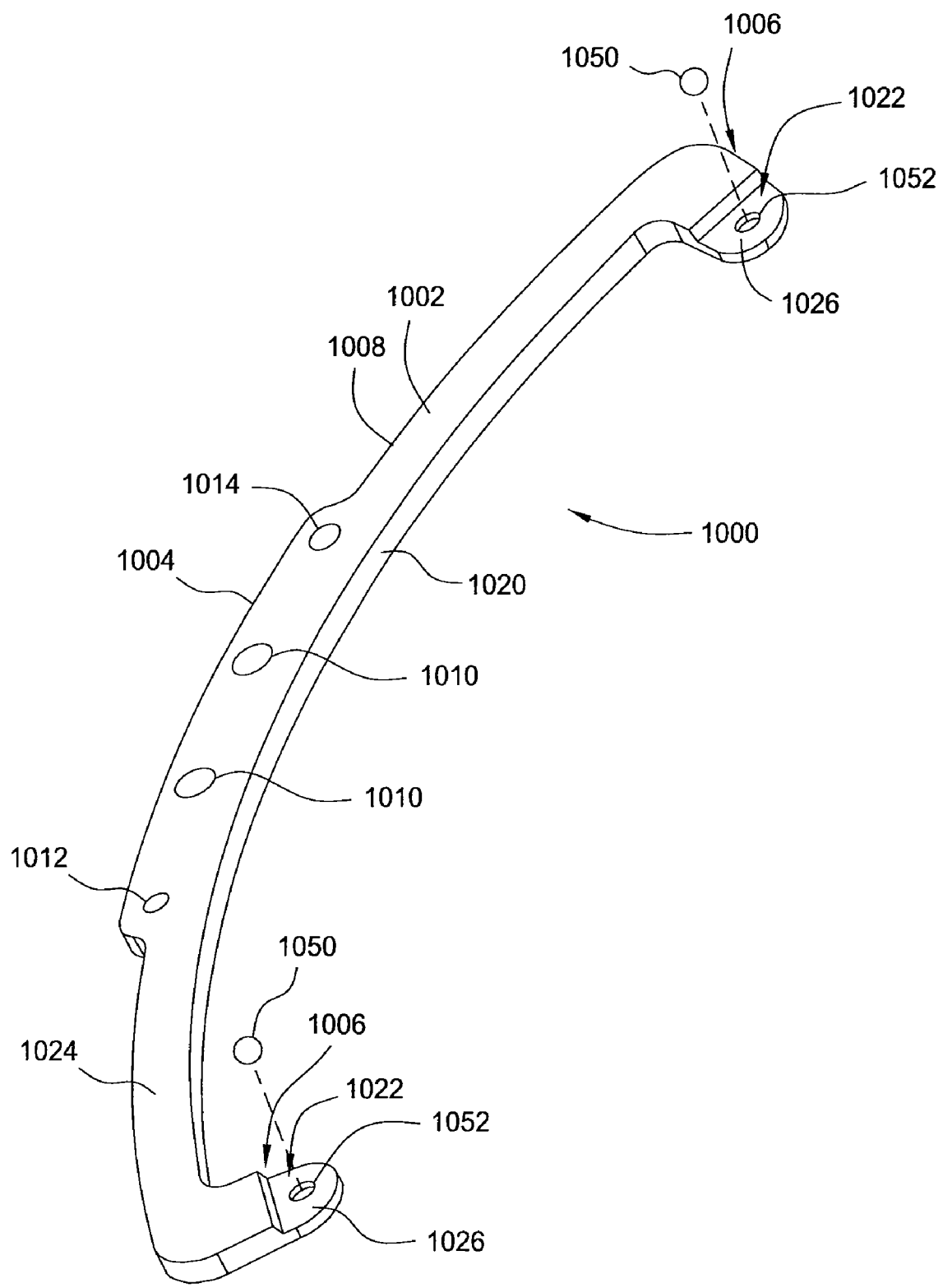
FIG. 10 depicts a perspective view of one embodiment of a substrate holder that may be utilized in the load lock chamber of FIG. 2, among other vacuum chambers.
Figure 11:
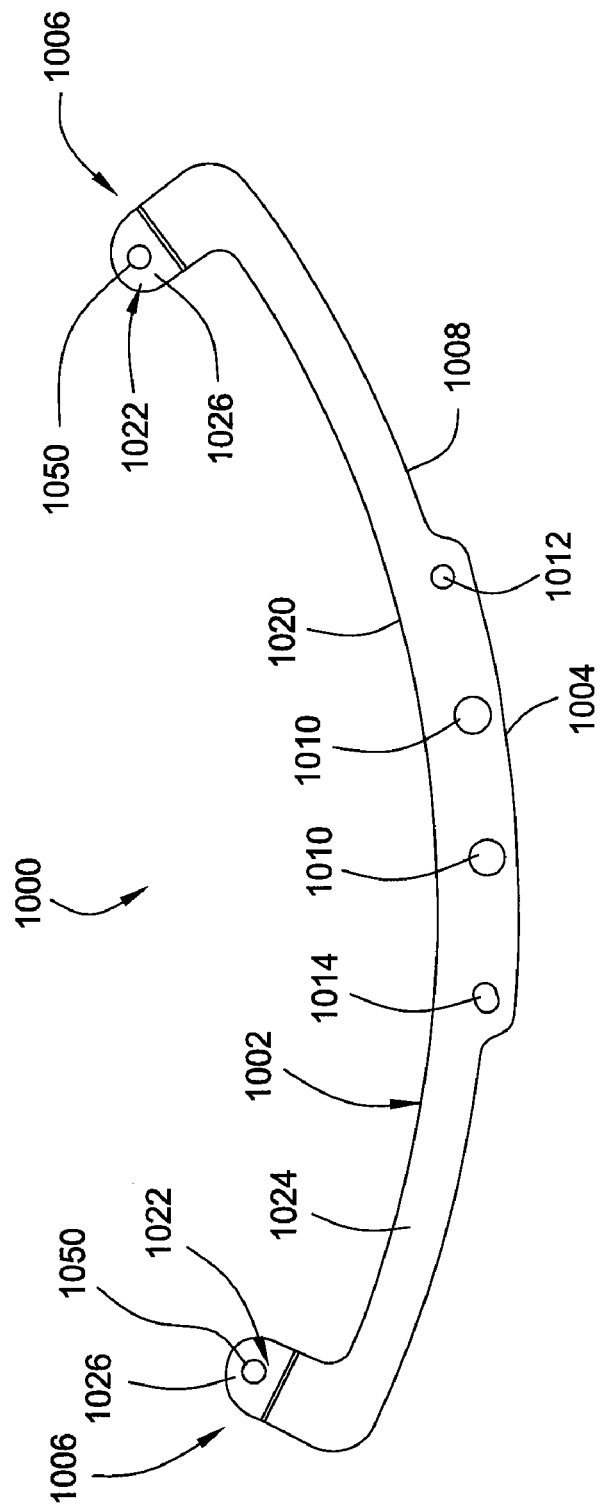
FIG. 11 depicts a top plan view of the substrate holder of FIG. 10.

FIGS. 10-11 depict a perspective and top plan views of one embodiment of a substrate holder 1000 that may be utilized in the load lock chamber 122 of FIG. 2, among other vacuum chambers. The substrate holder 1000 may be fabricated from aluminum or other suitable material. The substrate holder 1000 is designed to minimize contact with the substrate. The substrate holder 1000 includes an arc-shaped body 1002 having a mounting flange 1004 and two support flanges 1006. The mounting flange 1004 extends radially outward from an outer edge 1008 of the holder 1000. The mounting flange 1004 includes two dowel pin holes 1010, a mounting hole 1012 and a mounting slot 1014 to facilitate mounting of the holder 1000 to the hoop 220 (shown in FIG. 2) or other support structure. The hole 1012 and slot 1014 provides greater tolerances between the hoop 220 and holder 1000, while the dowel pin holes 1010 allow for precise orientation and location of the holder 1000 within the load lock chamber 122.

Each support flange 1004 extends radially inward from an inner edge 1020 of the holder 1000. The support flanges 1004 are positioned at opposite ends of the holder 1000.

Figure 12:
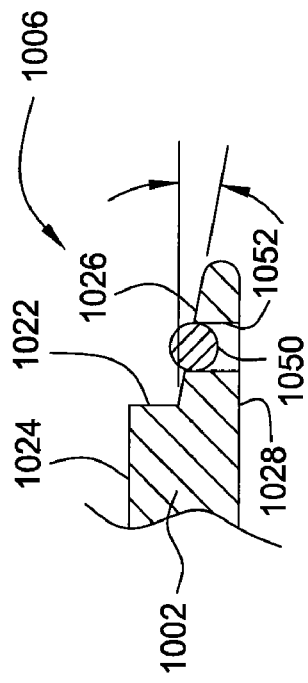
FIG. 12 is a partial sectional view of the substrate holder of FIG. 10.

Referring additionally to FIGS. 11 and 12, each of the support flanges 1004 includes a step 1022. In an alternative embodiment, each of the support flanges includes a flat end. The step 1022 is recessed from a top side 1024 of the holder 1000. The step 1022 includes a landing 1026 on which the substrate rests while on the holder 1000. The landing 1026 may have a substantially horizontal orientation, which is also substantially parallel to the top side 1024 and a bottom side 1028 of the holder 1000. The landing 1026 may alternatively be sloped downward relative to the horizon, thus having an orientation of between 2-5 degrees relative to the top side 1024 of the holder 1000. The inclined orientation of the landings 1026 allows the substrate to only contact the holder 1000 at the very edge of the substrate, thereby minimizing potential damage. Additionally, since the substrate solely contacts the holder 1000 on the two small landings 1026, potential damage to the substrate is further reduced over designs which have contact with the substrate along the complete length of the holder. Furthermore, the minimal contact to the substrate with the landings 1026 allows for better temperature control, as the bulk of the substrate is in contact or close proximity of the cooling pedestal which is thermally isolated from the holders.

Each step 1022 may alternatively include a hole 1052 formed in the step 1022. A contact ball 1050 is retained in the hole 1052 such that an edge of the ball 1050 extends above the surface of the step 1022. For example, the contact ball 1050 may be press-fit into the hole 1052. In one embodiment, the contact ball 1050 comprises silicon nitrate or other suitable material having a low heat transfer rate. As the substrate solely contacts the two contact balls 1050 of the holder 1000, thermal isolation between the substrate and holder 1000 is improved, thus resulting in improved substrate temperature control and faster heating of the substrate.

Thus, the present invention provides an apparatus for removing halogen and/or halogen-containing residues on a substrate. The apparatus advantageously prevents substrate contamination and corrosion of exposed portions of metallic films deposited on the substrate, along with preventing contamination and corrosion of the processing system from by released halogens, thereby enhancing productivity and process throughput.

While the foregoing is directed to embodiments of the present invention, other and further embodiments of the invention may be devised without departing from the basic scope thereof, and the scope thereof is determined by the claims that follow.

What is claimed:

1. A pedestal comprising:
a base comprising:
    an outer wall;
    a projection extending radially from the outer wall;
    a top surface;
    a bottom surface;
    a mounting feature positioned centrally within the base, the mounting feature having an aperture configured to accept an optical termination from the top surface;
    a recess formed on the bottom surface of the base; and
    a countersink formed on the top surface of the base, the countersink configured to permit the entry of light into the aperture; and
a cooling coil disposed in the recess adjacent the bottom surface of the base.

2. The apparatus of claim 1, wherein the base comprises: a window sealing the aperture.

3. The apparatus of claim 1, wherein the base further comprises:
a lens disposed within the aperture formed through the base.

4. The apparatus of claim 3, wherein the base further comprises:
an optical termination disposed in the aperture and coupled to the base, the optical termination aligned to receive optical transmissions through the aperture.

5. The apparatus of claim 3, wherein the base further comprises:
a raised rim extending from the top surface of the base.

6. The apparatus of claim 3, wherein the base further comprises:
a plurality of domes projecting from the top surface of the base.

7. The apparatus of claim 1, wherein the countersink has an angle greater than about 45 degrees.

8. A substrate holder comprising:
an arc-shaped body having a mounting flange extending radially outward from an outer edge of the holder;
two support flanges positioned at opposite ends of the body, each support flange extending radially inward from an inner edge of the body and having a substrate support step recessed from a top side of the body, each substrate support step having a sloped landing.

9. The substrate holder of claim 8, wherein the sloped landing of the support step further comprises:
a top surface,
a hole formed in the top surface; and
a contact ball disposed into the hole, the contact ball extending above the top surface.

10. The substrate holder of claim 9, wherein the contact ball comprises silicon nitrate.

11. The substrate holder of claim 8, wherein the sloped landing extends downward relative to the top side of the body, the sloped landing having an orientation of between about 2 to about 5 degrees relative to the top side of the body.

* * * * *